(12) United States Patent
Dempsey

(10) Patent No.: US 6,414,616 B1
(45) Date of Patent: Jul. 2, 2002

(54) ARCHITECTURE FOR VOLTAGE SCALING DAC

(75) Inventor: Dennis A. Dempsey, Limerick (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/602,100

(22) Filed: Jun. 22, 2000

(51) Int. Cl.⁷ .................. H03M 1/78; H03M 1/66
(52) U.S. Cl. ............................ 341/144; 341/154
(58) Field of Search .................. 341/144, 154, 341/136, 145, 153

(56) References Cited

U.S. PATENT DOCUMENTS

| | | | |
|---|---|---|---|
| 3,924,229 A | * 12/1975 | Liu ........................... 341/144 |
| 3,984,830 A | * 10/1976 | Buchanan et al. ......... 341/144 |
| 3,997,892 A | 12/1976 | Susset et al. |
| 4,542,368 A | * 9/1985 | Lillis ......................... 341/144 |
| 4,543,560 A | 9/1985 | Holloway |
| 4,558,242 A | 12/1985 | Tuthill et al. |
| 4,638,303 A | 1/1987 | Masuda et al. |
| 4,833,473 A | * 5/1989 | Dingwall ................... 341/154 |
| 4,918,448 A | 4/1990 | Hauviller et al. |
| 5,495,245 A | 2/1996 | Ashe |
| 5,703,588 A | 12/1997 | Rivoir et al. |
| 5,764,174 A | 6/1998 | Dempsey et al. |
| 5,943,000 A | 8/1999 | Nessi et al. |
| 5,969,657 A | 10/1999 | Dempsey et al. |
| 6,201,491 B1 | * 3/2001 | Brunolli et al. ............ 341/144 |

* cited by examiner

Primary Examiner—Peguy Jeanpierre
Assistant Examiner—Jean Bruner Jeanglaude
(74) Attorney, Agent, or Firm—Wolf, Greenfield & Sacks, P.C.

(57) ABSTRACT

An improved voltage scaling DAC responsive to an N-bit input code word having M LSBs including first and second outer impedance string segments, each comprising $2^{N-M}-1$ series-connected impedances of substantially equal value, an inner string of series-connected impedances of substantially equal value having first and second end points, first and second outer string switch networks providing electrical connections between selected outer string impedance terminals and first and second common nodes, and an inner string switch network providing electrical connection between selected inner string impedance terminals and an output node. The inner string of series-connected impedances comprises no more than $2^M-1$ impedances of substantially equal value. A method for adjusting the gain of a voltage scaling DAC is also described.

15 Claims, 9 Drawing Sheets

ARCHITECTURE FOR VOLTAGE SCALING DAC

FIELD OF THE INVENTION

This invention relates generally to digital-to-analog converters (DACs) and in particular to voltage scaling DACs, and is more particularly directed toward a fully symmetrical voltage scaling DAC with enhanced output range.

BACKGROUND OF THE INVENTION

Single string voltage scaling DACs produce an analog output voltage by selectively tapping a voltage-divider resistor string connected between high and low reference voltages, with the low reference generally being set at ground. FIG. 1 illustrates an N-bit converter, generally depicted by the numeral 100, in which a resistor string consisting of resistors R1, R2, . . . , R$2^N$ is connected between a high reference voltage (VREF+) node 2 and a low reference voltage (VREF−) node 4, which are typically five volts and ground, respectively. The voltage drop across each resistor is equal to one least significant bit (LSB) of output voltage range.

The output is sampled by a decoding switch network, illustrated as switches S1, S2, . . . , S$2^N$. Each switch taps a different point in the resistor string, so that closing a particular switch while leaving the others open places a unique analog voltage on a common output line 6 to which each of the switches is connected. For an N-bit system, this simple configuration requires $2^N$ resistors, $2^N$ switches, and $2^N$ logic control signals for unipolar switch implementations (one for each switch). For transmission gate switch implementations, $2^{N+1}$ logic control signals are required. Standard, unary binary coding is assumed for purposes of explanation.

One technique of the prior art that attempts to limit the total number of resistors required is described in U.S. Pat. No. 3,997,892 to Susset, and is illustrated in FIG. 2. The system incorporates a non-linear resistive divider 10 for the MSBs and a linear resistive divider 16 for the LSBs. These resistor strings 10, 16 are cascaded, with buffers 18, 20 isolating the current paths between strings. In this implementation, the second LSB impedance string 16 effectively "zooms in" on an individual MSB DAC resistor (R$_1$ through R$_4$). The LSB impedance string 16 serves to subdivide the voltage range across the MSB resistor, thereby increasing the resolution of the converter. A significant disadvantage of this architecture is that it requires buffers 18, 20 that dissipate additional power and occupy extra die area while introducing a new and different non-linear error source.

Perhaps one of the most common implementations of the basic voltage-mode DAC of the prior art includes an R/2R ladder network of resistors 20, as illustrated in FIG. 3. A network of switches 22, generally implemented as MOS transistors, determines the interconnection of the resistive elements either to the positive reference voltage V$_{REF}$ or to the negative reference voltage A$_{GND}$. In this embodiment, binary switch impedance scaling is used, as shown in FIG. 3. The specific switch settings are determined by the individual input code bits. A disadvantage of this architecture is that the total DAC current displays a very strong, non-linear code dependency. The number of resistors required for a DAC implementation can be reduced considerably, in comparison with the simple string DAC, by adopting the DAC of FIG. 4. In the implementation of FIG. 4, the DAC has an input digital code word of N bits, where M of the bits represent the LSBs and N-M of the bits consequently represent the MSBs. This convention, where M of the bits are assumed to represent the LSBs, will be adopted in the subsequent discussions. In FIG. 4, the outer resistor strings 10 and 12 decrement the input signal's MSBs, while the inner string 14 decrements the LSBs. Using this technique, the two identical outer strings 10, 12 of resistors and the inner string 14 have an output range of 0 to $2^{N}-1$*LSBS. As shown in FIG. 4, each of the two outer strings 10, 12 requires only $2^{N-M}-1$ resistors, while the inner string 14 needs $2^M$ resistors, a considerable savings in component count over the simple string implementation of FIG. 1.

In selecting a particular combination of switch closures in the embodiment illustrated in FIG. 4, the same number of outer string resistors (and they are of equal value) is always interposed between the V$_{REF+}$2 and V$_{REF-}$4 terminals. In other words, the inner string resistors 14 seem to "slide" along the outer strings 10, 12.

Yet another variation in voltage scaling DACs of the prior art, as shown in FIG. 5, has $(2^M-1)$ resistors Rb$_1$–Rb$_3$ in the LSB impedance string 33. In this implementation, the second impedance string 33 is coupled across, or in parallel with, a first impedance string 32 with $2^{N-M}$ resistors, Ra$_1$–Ra$_4$. The loading effect of the second impedance string 33 in parallel with a resistor of the first impedance string 32 is critical to the architecture. The second impedance string 33 uses a small portion of the current that flows in the first impedance string 32. The relative portion of the current flowing in the LSB impedance string 33 is dependent on the resolution of the converter and the actual design implementation detail, e.g., MSB DAC vs. LSB DAC resistor scaling and switch impedances. A disadvantage of this DAC architecture is that it manifests a highly non-linear output pin to reference pin impedance versus code transfer function, which renders it unsuitable for potentiometer applications.

A disadvantage of most prior art voltage scaling DAC architectures (with the exception of the DAC described above with reference to FIG. 5) is that the architectures are asymmetrical. There are applications in which it would be desirable simply to reverse the analog reference voltages and/or complement the digital inputs without compromising range or linearity. Most prior art architectures are simply incompatible with this type of modification.

A second disadvantage is that the output voltage range of these voltage scaling DAC implementations of the prior art does not extend all the way from the positive reference potential to the negative reference potential. Consequently, a need arises for an economically manufacturable, full-range, symmetrical DAC architecture.

SUMMARY OF THE INVENTION

These needs and others are addressed by the improved voltage scaling DAC of the present invention, in which the LSB resistor string implementation achieves full output range from a voltage scaling DAC with a linear output pin to reference pin impedance versus code transfer function.

In accordance with one aspect of the present invention, an improved N-bit voltage scaling DAC responsive to an N-bit input code word having M LSBs includes first and second outer impedance string segments, each comprising $2^{N-M}-1$ series-connected impedances of substantially equal value, an inner string of series-connected impedances of substantially equal value having first and second end points, first and second outer string switch networks providing electrical connections between selected outer string impedance terminals and first and second common nodes, and an inner string switch network providing electrical connection between selected inner string impedance terminals and an output node. The inner string of series-connected impedances comprises no more than $2^M-1$ impedances of substantially equal value. The series-connected impedances may comprise controlled MOS devices or resistors.

In one form of the invention, a first end of the first outer impedance string is coupled to a first reference voltage and a second end of the second outer impedance string is coupled to a second reference voltage. The first common node comprises the first inner string end point and the second common node comprises the second inner string end point. In another aspect of the invention, the first common node comprises a first reference voltage and the second common node comprises a second reference voltage.

In another form of the invention, an N-bit segmented impedance string DAC responsive to an N-bit input code word having M LSBs comprises first and second outer impedance networks, each including $2^{N-M}-1$ series-connected impedances of substantially equal value $R_O$ and wherein an end impedance of the first outer impedance network is connected to a first input node and an end impedance of the second outer impedance network is connected to a second input node, an inner impedance network including $2^M-1$ series-connected impedances of substantially equal value $R_I$, a first outer switch network coupling a selected terminal of one of the impedances of the first outer impedance network to a first end of the inner impedance network, a second outer switch network coupling a selected terminal of one of the impedances of the second outer impedance network to a second end of the inner impedance network, an inner switch network coupling a selected terminal of one of the impedances of the inner string to an output node, and switch control logic that selects a unique combination of switches corresponding to each input code word. The impedances may comprise controlled MOS devices or resistors. Preferably, the outer string impedance value $R_O$ is $2^M$ times larger than the inner string impedance value $R_I$.

In still another form of the invention, an N-bit segmented impedance string DAC responsive to an N-bit input code word having M LSBs comprises first and second outer impedance networks, each including $2^{N-M}-1$ series-connected impedances of substantially equal value $R_O$, an inner impedance network including $2^M-1$ series-connected impedances of substantially equal value $R_I$, and wherein an end impedance of the first outer impedance network is connected to a first end of the inner impedance network and an end impedance of the second outer impedance network is connected to a second end of the inner impedance network, a first outer switch network coupling a selected terminal of one of the impedances of the first outer impedance network to a first input node, a second outer switch network coupling a selected terminal of one of the impedances of the second outer impedance network to a second input node, an inner switch network coupling a selected terminal of one of the impedances of the inner string to an output node, and switch control logic that selects a unique combination of switches corresponding to each input code word. The impedances may comprise controlled MOS devices or resistors. Preferably, the outer string impedance value $R_O$ is $2^M$ times larger than the inner string impedance value $R_I$.

In accordance with yet another embodiment of the present invention, a method is provided for adjusting the gain of a voltage scaling DAC responsive to an N-bit input code word having M LSBs. The method comprises the steps of providing first and second outer impedance string segments, each comprising $2^{N-M}-1$ series-connected impedances of substantially equal value $R_O$, providing an inner string of no more than $2^M-1$ series-connected impedances of substantially equal value $R_I$, the inner string having first and second end points, providing first and second outer string switch networks that establish electrical connections between selected outer string impedance terminals and first and second common nodes, providing an inner string switch network that establishes electrical connections between selected inner string impedance terminals and an output node, and interposing an impedance between the inner string and one of the first and second outer strings to reduce overall gain of the voltage scaling DAC, wherein the interposed impedance is any non-zero impedance not equal to $R_I$.

Further objects, features, and advantages of the present invention will become apparent from the following description and drawings.

DETAILED DESCRIPTION OF THE INVENTION

In accordance with the present invention, an improved voltage scaling DAC is described that offers distinct advantages when compared with the prior art. As discussed previously, a single string voltage scaling DAC contains, in a single stage, all of the $2^N$ serially-coupled resistors that couple directly to the output by a switching network of $2^N$ switches. This is a very old architecture. Impedance strings follow Ohm's Law. Therefore, the string is guaranteed monotonic by design over all input codes. It can be regarded as the origin and focus of many subsequent voltage scaling DAC variants. Single string designs generally use $2^N$ resistors to yield $2^N$ output steps.

It should be noted that there are a number of ways of implementing resistance elements in discrete components or on integrated circuits. A controlled MOS device can effectively provide a desired impedance, although it is not, strictly speaking, a resistor. This technique of implementing resistance elements as controlled MOS devices is well-known in the art as described in U.S. Pat. No. 5,764,174 to Dempsey et al., which is fully incorporated by reference thereto as though fully set forth herein. Of course, there are other well-known methods of providing a desired impedance, including, but not limited to, thin-film resistor structures, polysilicon resistors, and resistor implementation through doping of predefined regions of a substrate via diffusion or ion-implantation.

There are a number of long-established DAC definition conventions that are still in use, and can be explained from the perspective of the string DAC architecture. The output level corresponding to an input code of zero equals, by convention, a zero output level (0 Volts or 0 Amperes). The subsequent discussion focuses solely on unipolar, voltage-mode DACs for ease of explanation. DAC output range is conventionally divided by the full numeric range, i.e., $2^N$, to yield the Least Significant Bit (LSB) size.

The ideal DAC output transfer function is then:

Output $=V_{REF-}+(DAC\ Word)^* (V_{REF+}-V_{REF-})/2^N$

This can also be expressed in terms of LSBs as:

Output $=V_{REF-}+(DAC\ Word^*LSB)$

Where: LSB $=(V_{REF+}-V_{REF-})/2^N$
or, in the alternative:

Output$=DAC$ Word*LSB

Where: $V_{REF-}=0$

When each code range/width is set equal to an LSB, as is conventionally done, combined with the fact that zeroscale (the minimum digital input code value) corresponds to a zero output voltage level, fullscale (a DAC input code word of $2^N-1$) corresponds to $V_{REF+}$—one LSB. Therefore, by convention, the DAC output voltage cannot reach the reference voltage $V_{REF+}$. The output range reduction of converters of the prior art has been predominantly at the top, due to the zero code convention, and the LSB size is equal to the output range divided by the number of LSBs ($2^N$).

Figure 3:
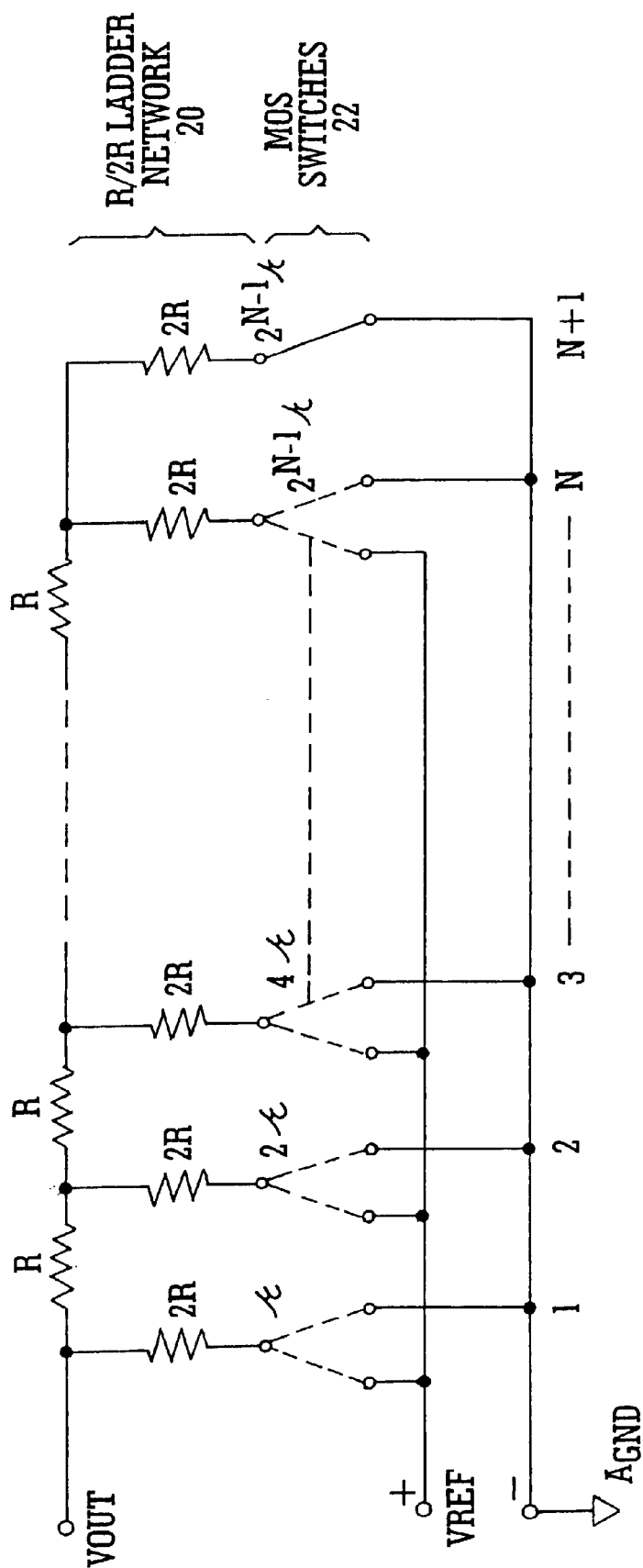
FIG. 3 illustrates an R/2R DAC of the prior art.

R/2R DACS, such as the one described with reference to FIG. 3 above, have naturally limited output range at the top end of the transfer function due to the termination leg resistor current (i.e., the current through the permanently ON switch at the end of the ladder network), because the termination leg is generally tied to the lower or negative reference potential (i.e., ground). The finite RON of the switches also causes some loss in output voltage at the top end, when the termination resistor is coupled to the negative reference. However, R/2R DACs can ideally provide a perfect zero level and, in practice, they are quite close. Therefore, a zero output level for a zero binary code input word and a $(2^N-1)/2^N$ output level for a fullscale DAC input word are generally attainable in this architecture. Once again, it is assumed that the termination leg is tied to the negative reference, which is the conventional configuration.

Figure 5:
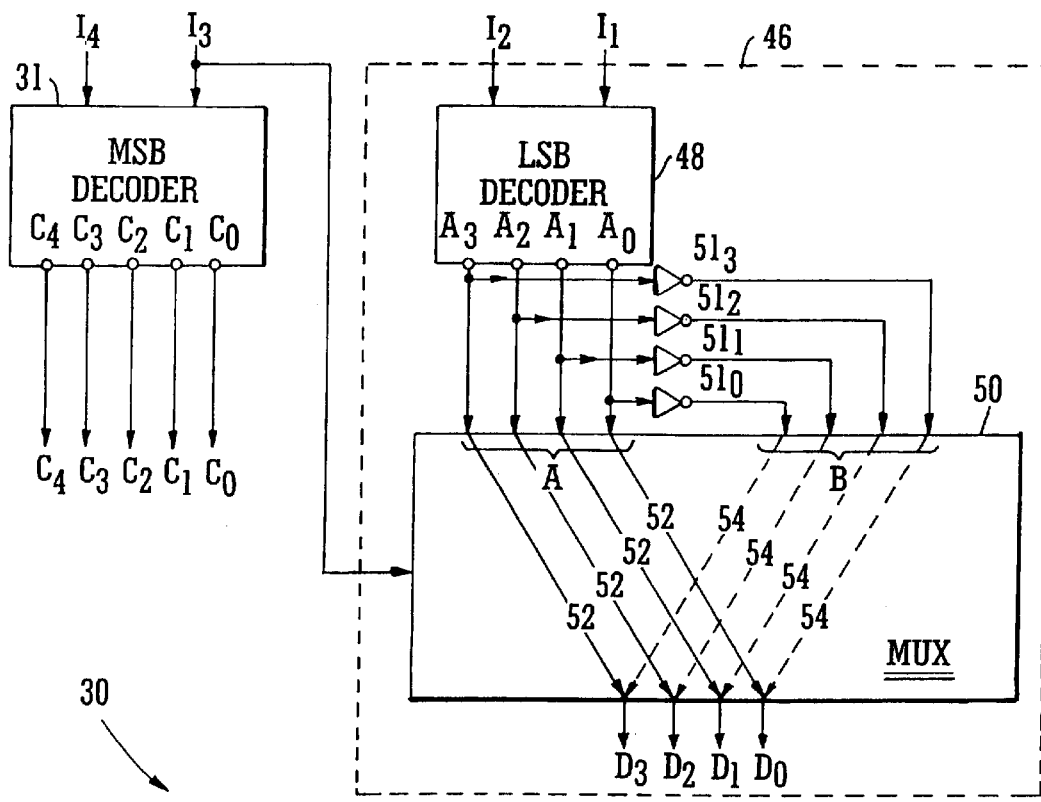
FIG. 5 is a schematic diagram of an alternative resistor string DAC implementation of the prior art.
Figure 5:
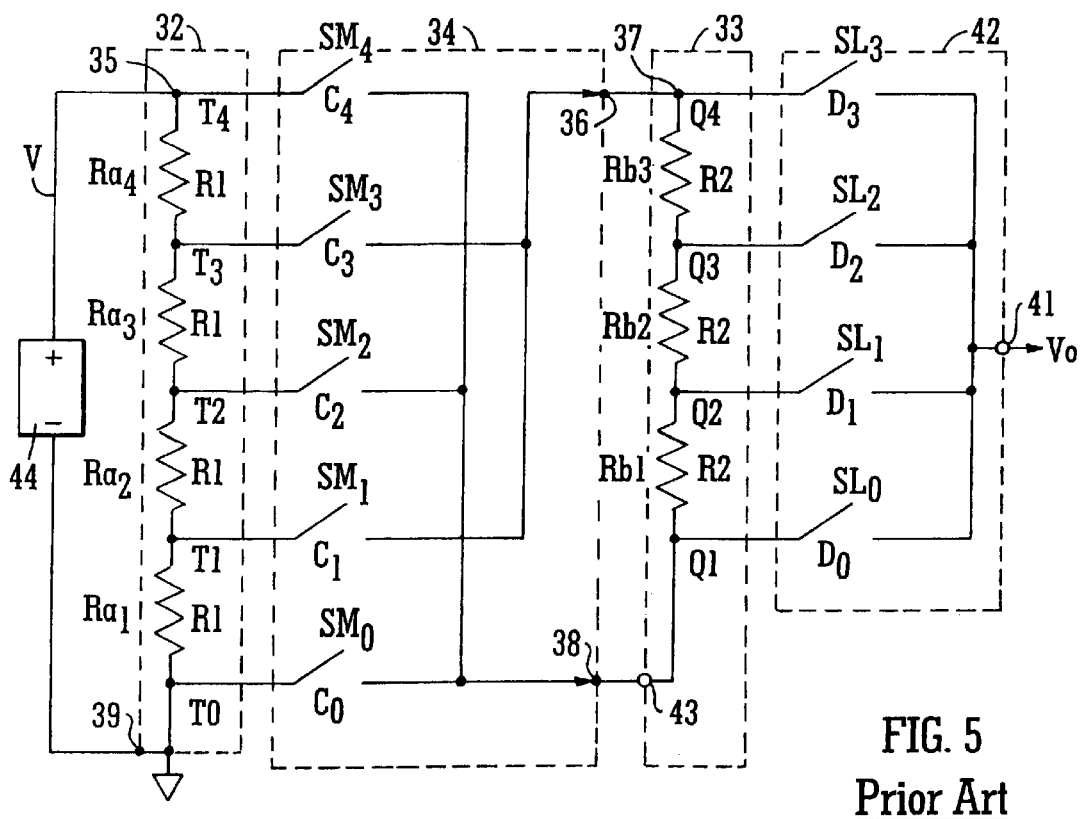

The majority of string DACs of the prior art employ $2^N$ resistors in some form of sub-DAC implementation, with $2^N$ nodes coupled to the output (the DAC described with reference to FIG. 5 above uses $2^N-1$ resistors in the LSB string). These sub-DACs may be single strings of $2^N$ resistors, as known in the earliest art, or segmented strings of MSB resistors as developed subsequently by Ashe and set forth in U.S. Pat. No. 5,495,245. Most of these prior art implementations share the common characteristic that the switch coupling mechanism does not couple all ($2^N$ +1) available terminals of the LSB string to the output. It should be noted, however, that the DAC of FIG. 5 has $2^N$ available terminals, from $2^N-1$ resistors, and it couples all of them.

Figure 1:
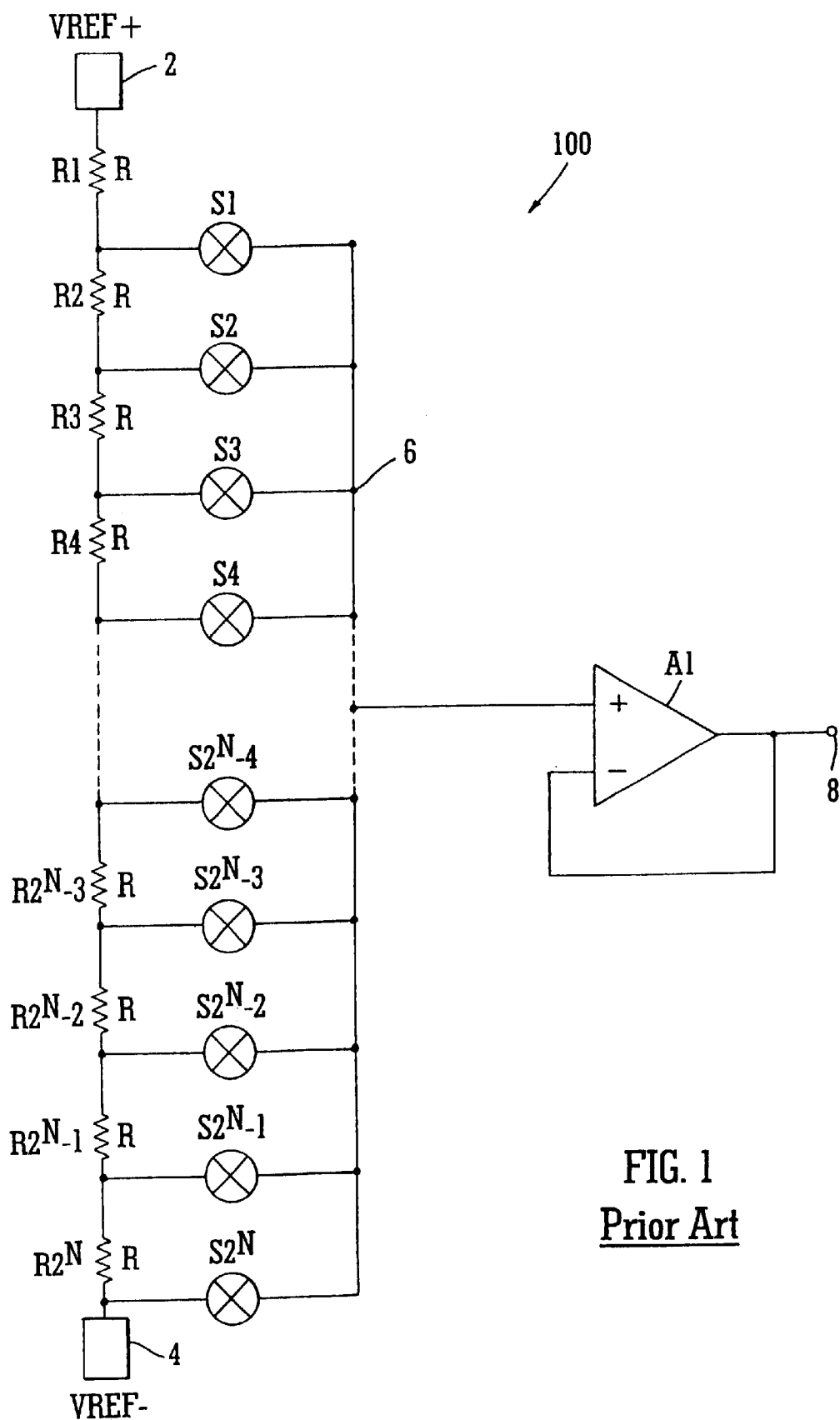
FIG. 1 depicts a single resistor string voltage scaling DAC of the prior art.
Figure 2:
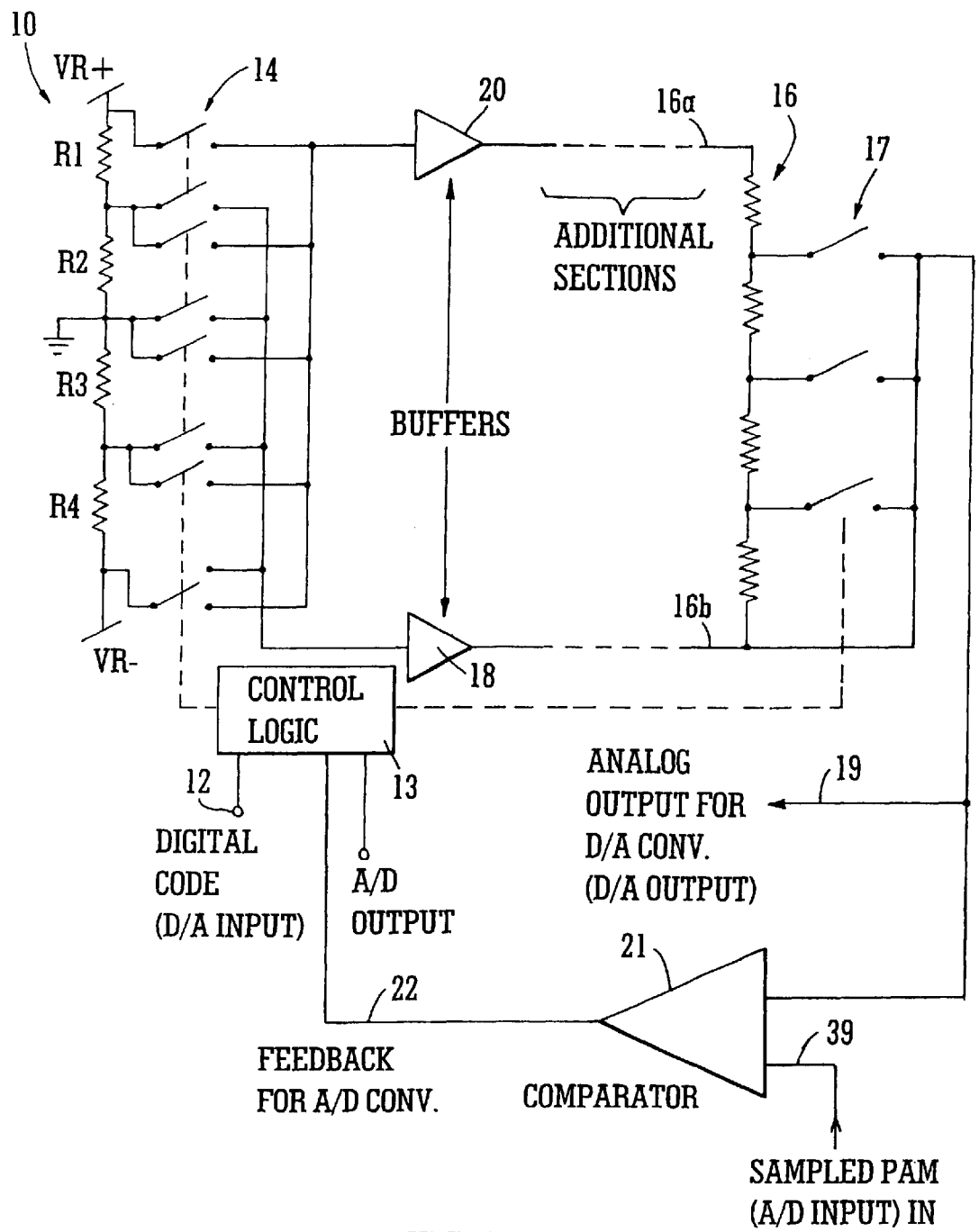
FIG. 2 shows a resistor string DAC of the prior art incorporating cascaded resistor strings with buffer isolation.

The buffered multiple string DAC of prior art FIG. 2 was developed because previous un-buffered versions were non-ideal due to the loading effect of the second, LSB impedance string. There are many more architectures that "zoom in" on a particular MSB string impedance using $2^M$ series resistors, in a switched LSB impedance string, in a similar fashion. This was, and still is, one of the most common methods of sub-dividing the voltage across an impedance.

Figure 4:
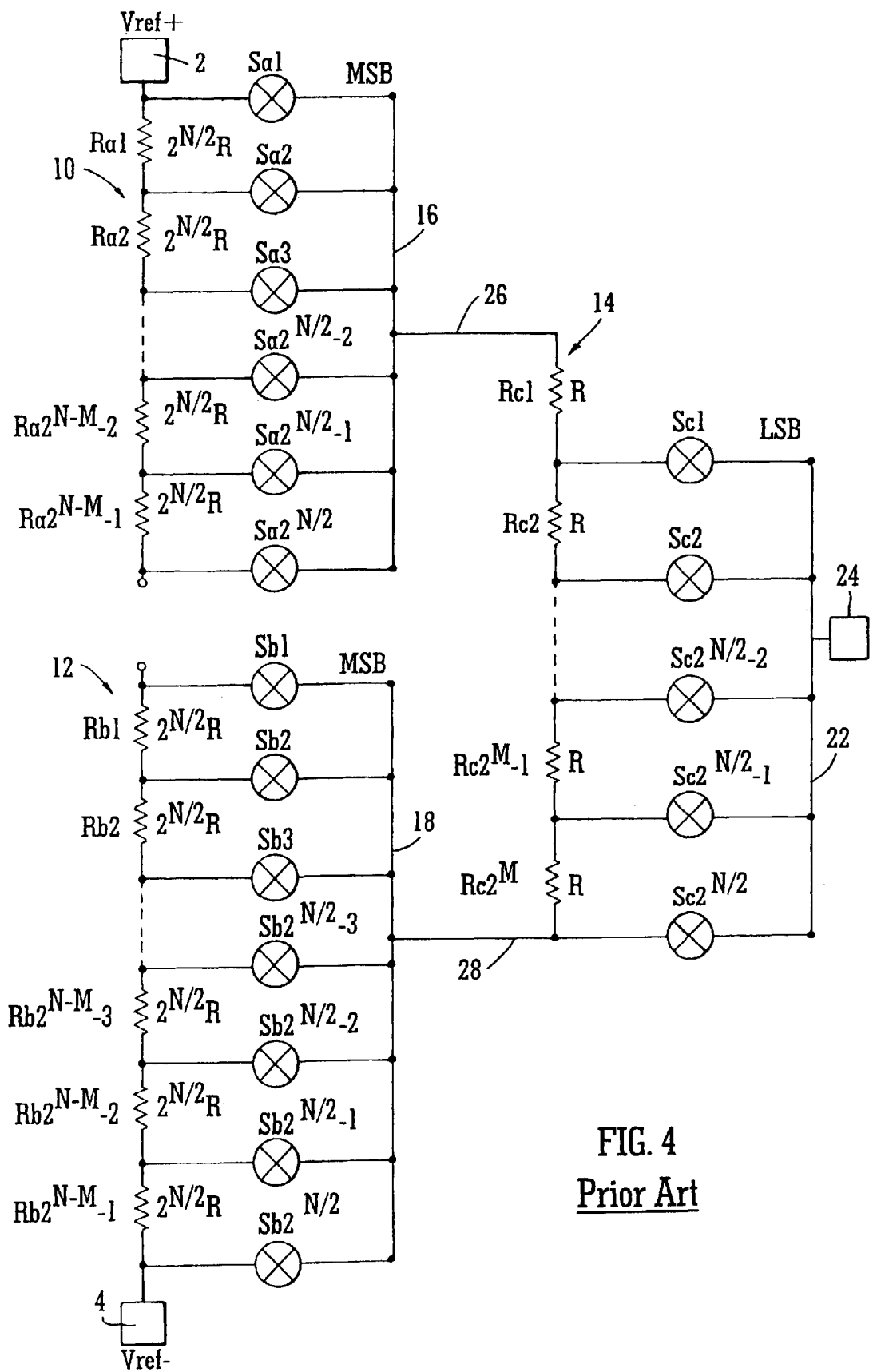
FIG. 4 depicts a segmented resistor string DAC that is known in the art.

The implementation illustrated in FIG. 4 has MSB resistors that are matched to the LSB DAC string ($R_{MSB}=2^{M}*R_{LSB}$) where $2^M$ is the number of resistors in the LSB impedance string. The MSB switches of FIG. 4 are positioned between the MSB sub-DAC and the LSB sub-DAC.

The architecture of FIG. 4 does not use an LSB string in parallel with an MSB resistor, but actually substitutes one, and only one, MSB resistor with an equivalent LSB impedance string to perform a "zoom in" function. A key element in these potentiometer DACs is that only two MSB switches are electrically "ON" in the MSB strings. The switching change is key to this DAC implementation.

An alternative architecture of the prior art actually swaps each MSB resistor using switches in series with each terminal of the MSB resistors. This is similar to current practice except for one critical difference. The older approach requires many switches (which are, of course, non-ideal in practice) in series with the resistors of the MSB impedance string. Thus, this particular switched DAC architecture deviated far from the ideal and was thus deemed impractical in many applications.

Most preferred implementations of the LSB and MSB impedance strings use multiple DAC unit resistors in series to form a single MSB unit resistor and, conversely, multiple DAC unit resistors in parallel for each of the LSB unit resistors in the longer impedance chain of the LSB string. General construction of DAC impedance chains, or strings, using unit resistors is a long-proven practice that promotes insensitivity to manufacturing defects.

In order to reduce the gain of a particular DAC implementation, series impedance can be added in series with a DAC reference terminal. Adding a resistor in series with the negative reference terminal both reduces the channel gain and increases the zero code level (sometimes called the "offset" level in a unipolar reference system) by the same amount. On the other hand, adding impedance in series with the positive reference terminal reduces the DAC channel gain without changing the zero code level.

In order to increase the gain of these DAC architectures, it would seemingly be required to reduce the value of the top MSB resistor, thereby "pulling up" the top of the DAC. If this were done, however, the top MSB resistor would not match up correctly, either with the other MSB impedances or with the LSB impedance string. This mismatch would cause a differential nonlinearity (DNL) error. The LSB string would also be incorrect, and would thus need to be reduced also to match the new, incorrect MSB. A subsequent LSB impedance change would not effectively compensate for the MSB reduction, but would, instead, introduce an additional error. There would thus seem to be no solution to the problem of increasing DAC gain in a potentiometer configuration.

The potentiometer DAC architectures' range seems limited at first examination by the top MSB resistor, which should match the LSB impedance string like all other MSB resistors. The MSB DAC string, by definition, is controlled by the MSBs. Similarly, the LSB string is controlled by the LSBs. The total LSB string impedance, ideally, should equal one MSB impedance string resistor, and in this way, both strings interact without problems as the LSB string is swapped in and out in place of a particular MSB resistor. If the LSB DAC impedance does not match a particular MSB resistor, this causes MSB DAC integral nonlinearity (INL) "step" errors.

INL (sometimes just called "nonlinearity" or "relative accuracy") is the deviation of the actual converter output from a straight line drawn between the end points of the converter's input-output transfer function. This error is quite difficult to measure, since it is basically the difference between two very large numbers. INL is often measured by comparing the unit under test to a converter of known accuracy, then reading the errors with a null meter.

DNL, on the other hand, is a measure of the deviation between actual analog output change and the theoretical change of 1 LSB when the digital input changes by one bit. DNL is generally specified at room temperature in LSBs, or as a percentage of full scale range (FSR). It is a function of both time and temperature; therefore its drift is often given in PPM (parts-per-million) per 1000 hours, or PPM/°C.

In any case, in all of the potentiometer resistor string DAC architectures of the prior art, the LSB resistors always match the MSB resistor, because the LSB string effectively replaces the MSB resister on an MSB code-by-code basis. The LSB impedance string voltage range is, therefore, identical for each MSB code configuration.

In summary, previous architectural decisions have supported the propositions that the total LSB impedance string impedance should match every MSB resistor in the same way, and that all MSB resistors should match each other. These design decisions have resulted in what the designers believed was optimum performance, while maintaining ease of manufacturing and relatively low cost.

There are several aspects that earlier designers have missed, however, when considering the multiple string potentiometer DAC architectures. First, the multi-stage architectures' current paths are different. Currents are not shared in the potentiometer DACs. For this reason, the prior art potentiometer DAC discussed with reference to FIG. 4 above can be regarded as a tri-string DAC. Of course, the DAC of FIG. 4 includes appropriate switch control logic to select particular values of resistors corresponding to the digital input code word to the DAC. The control logic and switching circuitry is described in detail in U.S. Pat. No. 5,495,245, which is fully incorporated by reference thereto as though fully set forth herein.

Second, the reference current flows though all of the active portion of the DAC string, which is a constant ($2^N$) times the LSB resistance. The output pin to reference impedance is code variable, but the overall DAC impedance ideally does not change. And third, the two MSB impedance strings and the LSB impedance string are in series. Consequently, they can be interchanged without overall impedance change.

LSB resistor Rc1 in the LSB string 14 is effectively unused electrically in the circuit of FIG. 4, although it serves a good purpose for ease of manufacturing. This unused resistor Rc1 can be identified as the only resistor with only one terminal tapped to the output terminal 24 of the LSB impedance string 14. The fact that it really serves no linearity purpose is very unusual, and not true for other types of multi-stage architectures.

When the LSB impedance string 14 is substituted for the top MSB resistor, the unused top LSB resistor Rc1 performs no role in the linearity of the DAC transfer function. The role of this resistor is at the top end of the overall transfer function when it, in series with the other LSB resistors and the MSB resistors, yields $(2^N-1)/2^N$*LSB at the output. The "extra" LSB impedance string resistor Rc1 provides the one LSB gain loss in the overall DAC channel.

In the string DAC code configurations with the LSB impedance string in place of the topmost LSB resistor, one may reduce the total DAC impedance from $2^N$*$R_{LSB}$ to $(2^N-1)$*$R_{LSB}$ by short-circuiting the terminals of this one "extra" LSB resistor and removing it, or effectively removing it from the active circuitry by simply short-circuiting the terminals but not actually removing the resistor. The "extra" LSB resistor may or may not be left in place, for reasons of manufacturability, but it will no longer play an electrical role in the circuit.

Figure 6:
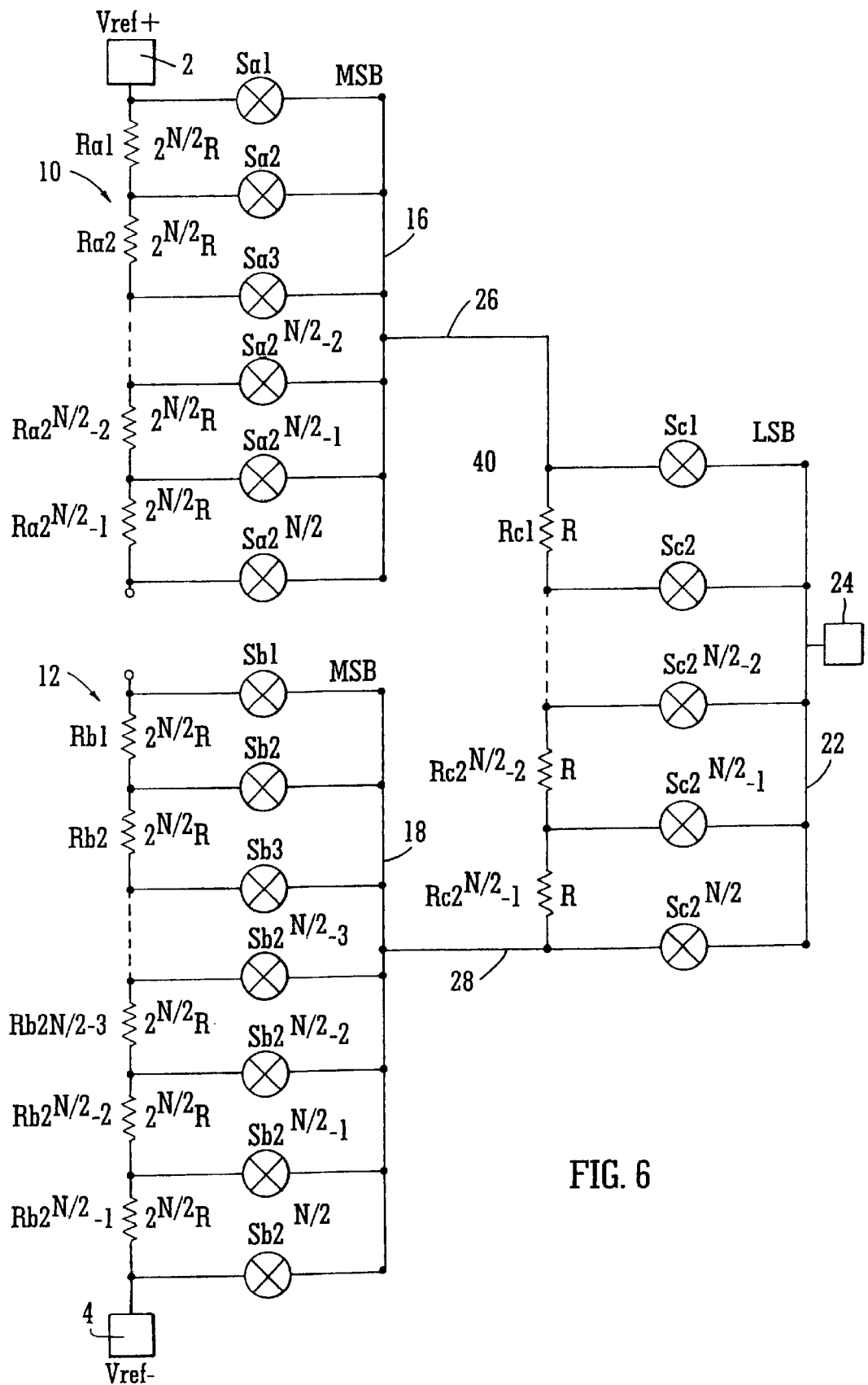
FIG. 6 depicts a segmented resistor string DAC in accordance with the present invention.

Since it is possible to interchange the three impedance strings without overall impedance change, this suggests that this string can be reconfigured to perform the normal DAC function, but with the full DAC output range. If this resistor is removed, and DAC linearity is checked once again, it is found that full output voltage range has been achieved with no loss of functionality. The voltage scaling DAC architecture in accordance with the present invention, with the "extra" LSB resistor removed, is illustrated in FIG. 6. Note that, in this embodiment, both of the end switches Sc1, Sc$2^M$ of the inner string 40 are directly coupled to the output nodes 16, 18 of the outer strings 10, 12.

It has been demonstrated that the topmost resistors in the LSB impedance string, as with extra impedance in series with the top of the upper MSB string, serve to reduce the gain of the DAC. Inserting resistors in the upper end of the LSB string is the preferred technique for further fine DAC gain reduction. "Extra" LSB impedance string resistors are the preferred method of reducing the DAC gain by less than an MSB. For gain reduction greater than an MSB, at least one MSB resistor should be used in series with the upper MSB impedance string to reduce the DAC gain by modulo-MSB factors.

Figure 8:
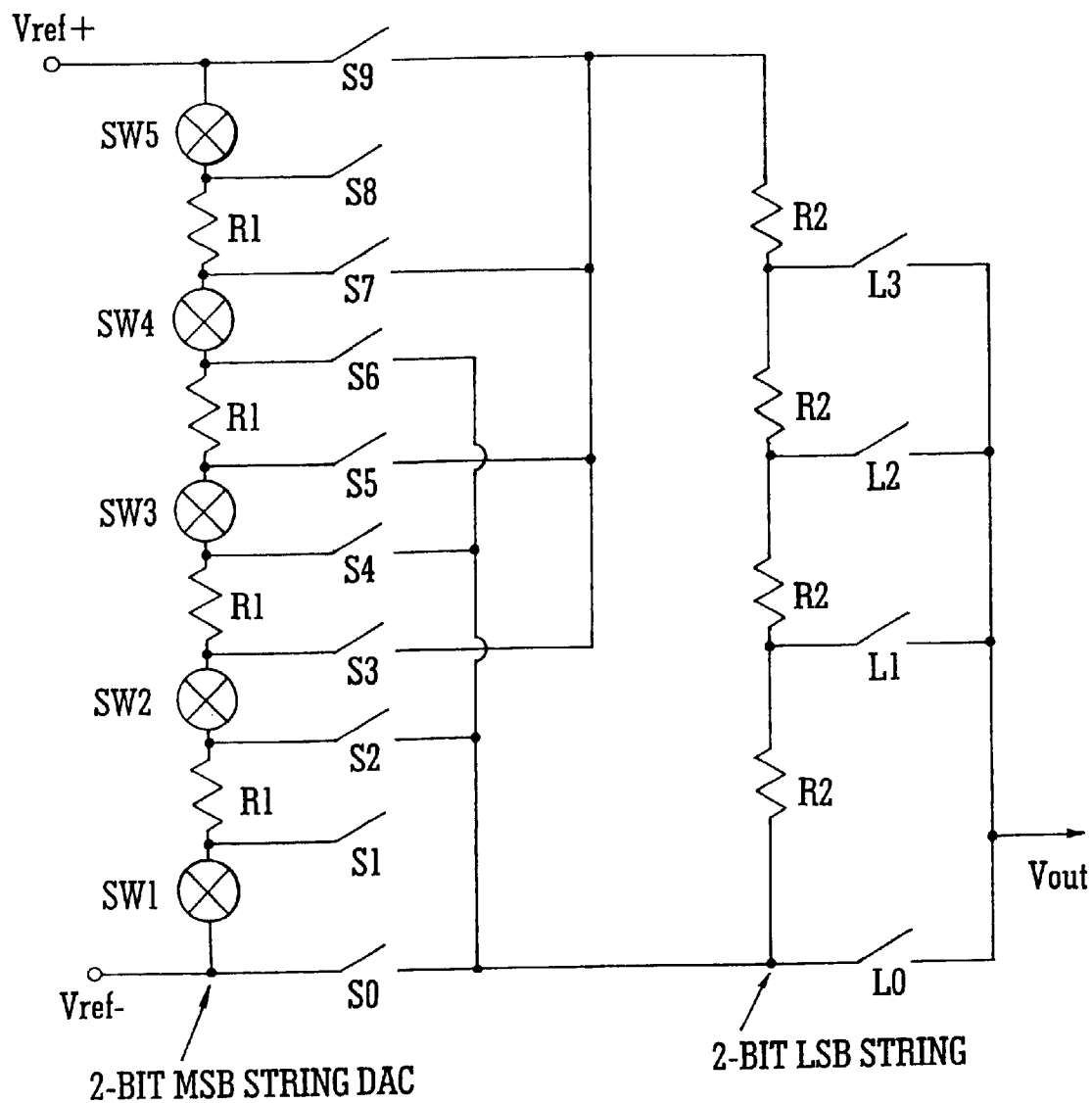
FIG. 8 is a simplified view of another prior art 4-bit DAC implementation.

FIG. 8 is a simplified view of another prior art 4-bit DAC having a 2-bit MSB string DAC and a 2-bit LSB string. In this implementation, a selected MSB string resistor is switched out and an LSB string of equivalent resistance is substituted in order to "zoom in" on a particular MSB. As discussed previously, this technique reduces the number of resistors required when compared to a single string approach. Finite (non-zero) switch impedance non-idealities introduce INL issues into this architecture. Switch selection versus MSB digital input code is represented in the following table:

| MSB CODE | SW1 | SW2 | SW3 | SW4 | SW5 | $S_0$ | $S_1$ | $S_2$ | $S_3$ | $S_4$ | $S_5$ | $S_6$ | $S_7$ | $S_8$ | $S_9$ |
|---|---|---|---|---|---|---|---|---|---|---|---|---|---|---|---|
| 0 0 | 0 | 0 | 0 | 1 | 1 | 1 | 1 | X | 0 | 1 | 0 | 0 | 0 | 0 | X | 0 |
| 0 1 | 1 | 0 | 0 | 1 | 1 | 0 | X | 1 | 0 | 0 | 1 | 0 | 0 | X | 0 |
| 1 0 | 1 | 1 | 0 | 0 | 1 | 0 | X | 0 | 0 | 1 | 0 | 0 | 1 | X | 0 |
| 1 1 | 1 | 1 | 1 | 0 | 0 | 0 | X | 0 | 0 | 0 | 0 | 1 | 0 | X | 1 | where 1=ON, 0=OFF, and X=DON'T CARE. LSB string switching is straightforward, consequently no table is provided.

MOS switches are not sufficiently ideal for high-quality, higher resolution implementations of this converter architecture. In the RDAC of FIG. 8, switches $S_0$ through $S_9$ are the MSB switches. The ON resistance of these MSB switches is preferably identically equal to the ON resistance of switches SW1 through SW5. The sum of the $R_2$s ($4*R_2$) is equal to $R_1$. $L_0$ through $L_3$ are the LSB control switches in this implementation, and it should be noted that switches $S_1$ and $S_8$ are not required.

If the ON resistance of switches $S_0$ through $S_9$ equals the ON resistance of switches SW1 through SW5, and the ON resistance of switches SW1 through SW5 did not vary versus input code value, then this would be an ideal solution in linearity terms (with ideal resistors). The real-world problem is that the ON resistance of switches SW1 through SW5 does, in fact, vary with the input code value. The architecture of FIG. 8 has many switches in series in the MSB string. An advantage of the RDAC implementations is that they do not have an abundance of series-connected switches in the MSB string; they have only two, which is the minimum.

Figure 9:
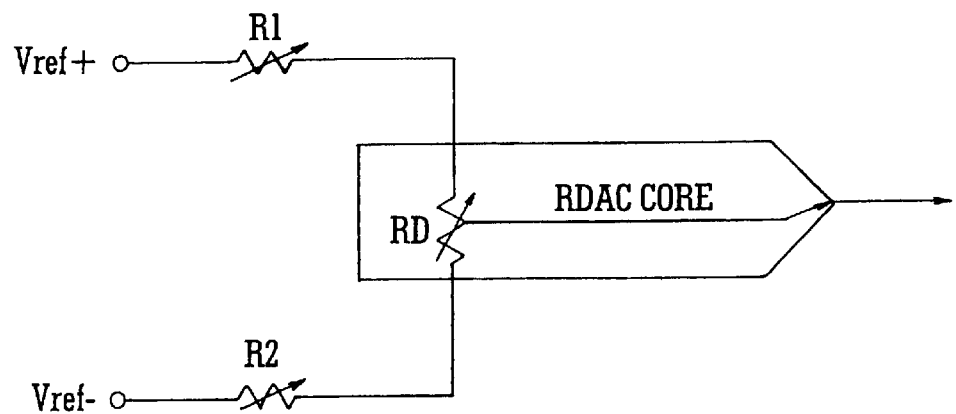
FIG. 9 illustrates RDAC gain adjustment through the addition of impedances to the outer strings.

FIG. 9 illustrates one methodology for DAC gain and offset adjustment. Resistors R1 and R2 are simply added to the outer strings. These resistors ($R_1$, $R_2$) can have any value greater than or equal to zero, and less than infinity (cannot be an open circuit).

Figure 10:
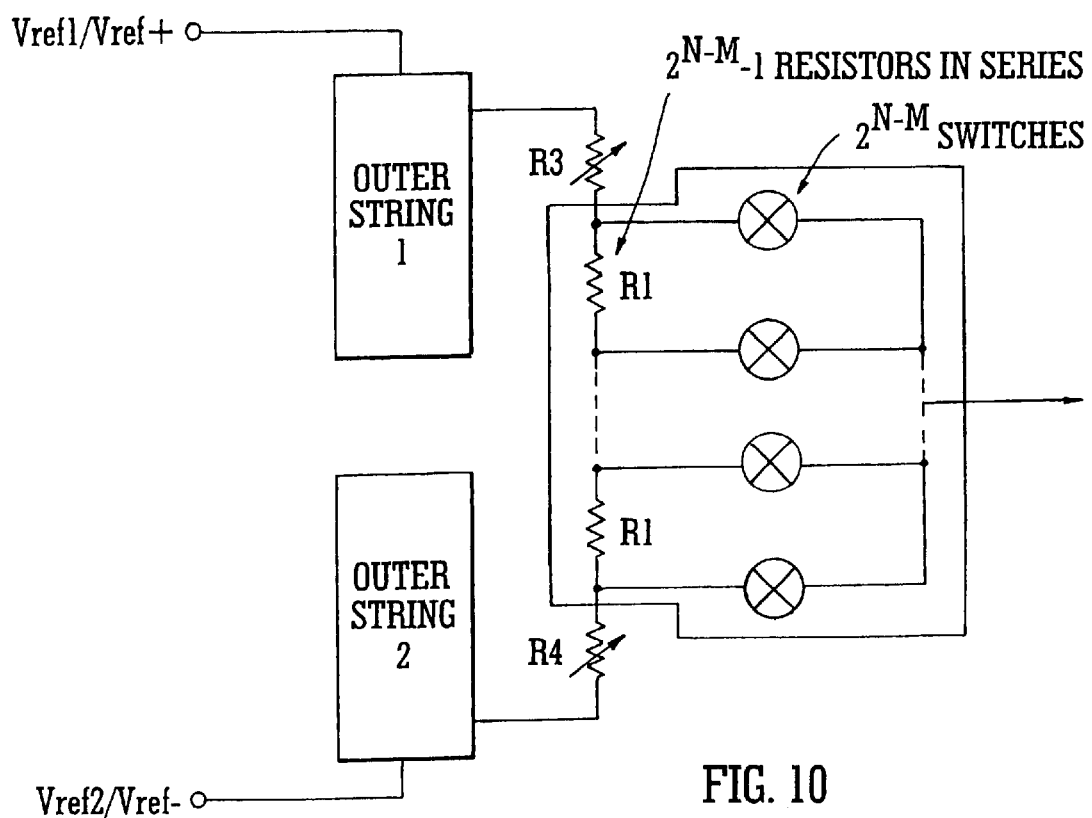
FIG. 10 shows impedance added to the RDAC inner string for purposes of gain adjustment.

FIG. 10 shows how RDAC gain adjustment can be effected through the addition of a resistor to the inner string. $R_3$ and $R_4$ both equal to zero is the preferred implementation, as described above, for a symmetrical RDAC architecture. However, for gain reduction purposes, R3 can be allowed to assume any non-zero value not equal to $R_I$.

Figure 7:
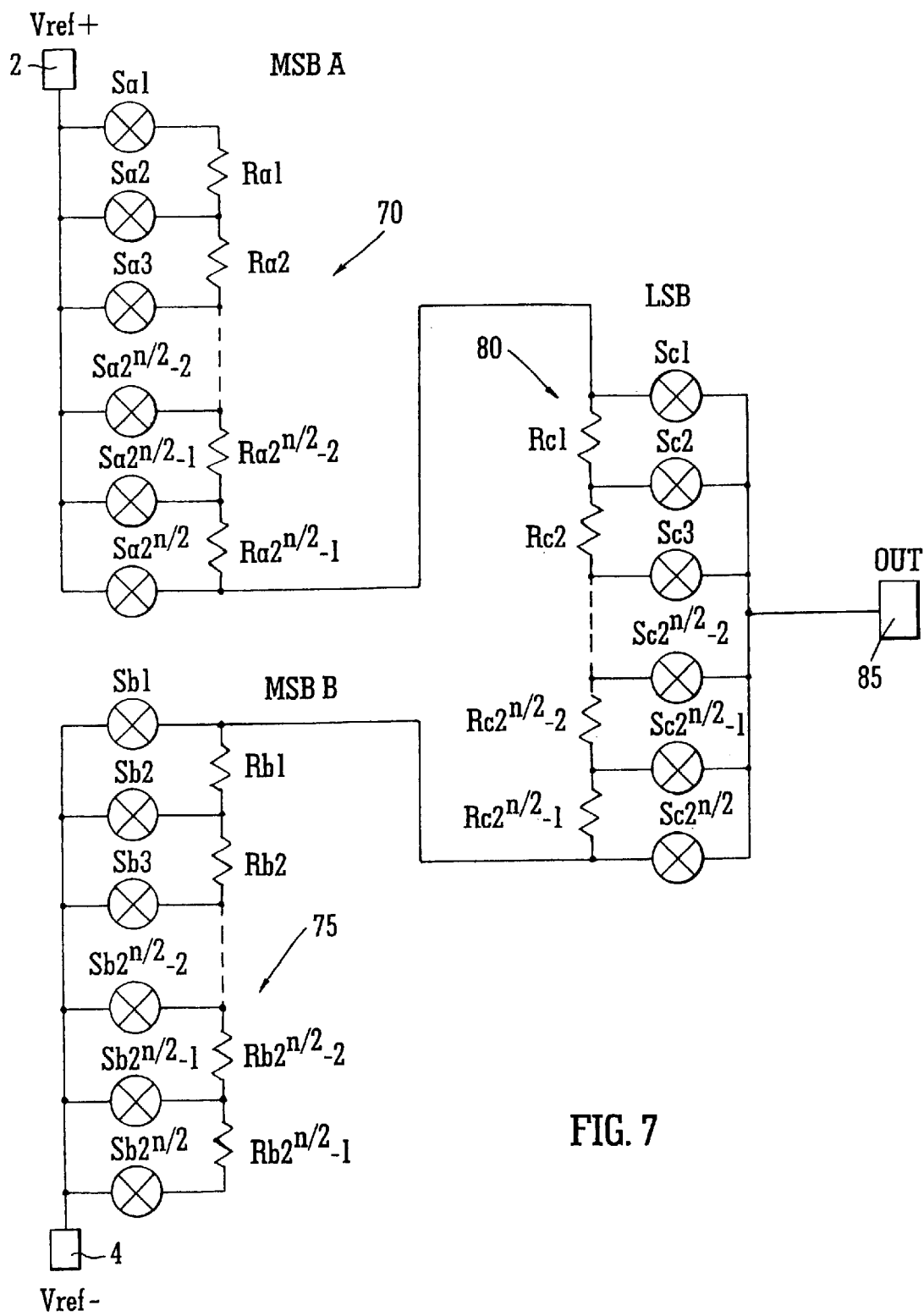
FIG. 7 is an alternative embodiment of a segmented resistor string DAC in accordance with the present invention.

In the DAC implementation illustrated in FIG. 7, the positions of the switches (Sa1–Sa$2^M$ and Sb1–Sb$2^M$) in the outer switch networks have been altered to remove the common-mode code dependency of the outer switch networks in any static reference position. This improves switch mismatch significantly, and thus yields improved linearity performance for a given switch size under static conditions.

In FIG. 7, the switch networks associated with the outer strings 70, 75 selectively couple one of the resistor string terminals to one of the reference potential inputs, either $V_{ref+}2$ or $V_{ref-}4$. One end of each of the outer resistor strings is coupled to an end point of the inner resistor string 80. Just as in FIG. 6, the inner string switches are all connected at one end to an output node 85.

Just as in the embodiment of FIG. 6, the DAC of FIG. 7 has only $2^M-1$ resistors in the inner string 80. Both of the end switches Sc1, Sc$2^{N-M}$ of the outer string 40 are directly coupled to the output nodes 16, 18 of the outer strings 10, 12. Any terminal of any of the resistors in the inner string 80 may be coupled to the output by one of the switches of the outer switch network. This is not true of previous tri-string architectures. The architecture of FIG. 7 is also fully symmetrical. The analog references can be reversed and the digital inputs complemented to give an identical result, or the function of the DAC can be reversed by reference reversal or input complementing.

There has been described herein an improved voltage scaling DAC architecture that has distinct advantages when compared with DAC architectures of the prior art. It will be apparent to those skilled in the art that modifications may be made without departing from the spirit and scope of the invention. Accordingly, it is not intended that the invention be limited except as may be necessary in view of the appended claims.

What is claimed is:

1. An improved voltage scaling DAC responsive to an N-bit input code word having M LSBs including:
    first and second outer impedance string segments, each comprising $2^{N-M}-1$ series-connected impedances of substantially equal value;
    an inner string of series-connected impedances of substantially equal value having first and second end points;
    first and second outer string switch networks providing electrical connections between selected outer string impedance terminals and first and second common nodes; and
    an inner string switch network providing electrical connection between selected inner string impedance terminals and an output node;
    wherein the improvement comprises:
    the inner string of series-connected impedances comprises no more than $2^M-1$ impedances of substantially equal value.

2. The improved N-bit voltage scaling DAC of claim 1, wherein said series-connected impedances comprise controlled vOS devices.

3. The improved N-bit voltage scaling DAC of claim 1, wherein said series-connected impedances comprise resistors.

4. The improved N-bit voltage scaling DAC of claim 1, wherein a first end of the first outer impedance string is coupled to a first reference voltage and a second end of the second outer impedance string is coupled to a second reference voltage.

5. The improved N-bit voltage scaling DAC of claim 1, wherein said first common node comprises the first inner string end point and said second common node comprises said second inner string end point.

6. The improved N-bit voltage scaling DAC of claim 1, wherein said first common node comprises a first reference voltage and said second common node comprises a second reference voltage.

7. An N-bit segmented impedance string DAC responsive to an N-bit input code word having M LSBs, the DAC comprising:
    first and second outer impedance networks, each including $2^{N-M}-1$ series-connected impedances of substantially equal value $R_O$ and wherein an end impedance of the first outer impedance network is connected to a first input node and an end impedance of the second outer impedance network is connected to a second input node;
    an inner impedance network including $2^M-1$ series-connected impedances of substantially equal value $R_I$;
    a first outer switch network coupling a selected terminal of one of the impedances of the first outer impedance network to a first end of the inner impedance network;
    a second outer switch network coupling a selected terminal of one of the impedances of the second outer impedance network to a second end of the inner impedance network;
    an inner switch network coupling a selected terminal of one of the impedances of the inner string to an output node; and
    switch control logic that selects a unique combination of switches corresponding to each input code word.

8. The N-bit segmented impedance string DAC of claim 7, wherein said impedances comprise controlled MOS devices.

9. The N-bit segmented impedance string DAC of claim 7, wherein said impedances comprise resistors.

10. The N-bit segmented impedance string DAC of claim 7, wherein the outer string impedance value $R_O$ is $2^M$ times larger than the inner string impedance value $R_I$.

11. An N-bit segmented impedance string DAC responsive to an N-bit input code word having M LSBs, the DAC comprising:

first and second outer impedance networks, each including $2^{N-M}-1$ series-connected impedances of substantially equal value $R_O$;

an inner impedance network including $2^M-1$ series-connected impedances of substantially equal value $R_I$, and wherein an end impedance of the first outer impedance network is connected to a first end of the inner impedance network and an end impedance of the second outer impedance network is connected to a second end of the inner impedance network;

a first outer switch network coupling a selected terminal of one of the impedances of the first outer impedance network to a first input node;

a second outer switch network coupling a selected terminal of one of the impedances of the second outer impedance network to a second input node;

an inner switch network coupling a selected terminal of one of the impedances of the inner string to an output node; and switch control logic that selects a unique combination of switches corresponding to each input code word.

12. The N-bit segmented impedance string DAC of claim 11, wherein said impedances comprise controlled MOS devices.

13. The N-bit segmented impedance string DAC of claim 11, wherein said impedances comprise resistors.

14. The N-bit segmented impedance string DAC of claim 11, wherein the outer string impedance value $R_O$ is $2^M$ times larger than the inner string impedance value $R_I$.

15. A method for adjusting the gain of a voltage scaling DAC responsive to an N-bit input code word having M LSBs, the method comprising the steps of:

(a) providing first and second outer impedance string segments, each comprising $2^{N-M}-1$ series-connected impedances of substantially equal value $R_O$;

(b) providing an inner string of no more than $2^M-1$ series-connected impedances of substantially equal value $R_I$, said inner string having first and second end points;

(c) providing first and second outer string switch networks that establish electrical connections between selected outer string impedance terminals and first and second common nodes;

(d) providing an inner string switch network that establishes electrical connections between selected inner string impedance terminals and an output node; and (e) interposing an impedance between said inner string and one of said first and second outer strings to reduce overall gain of said voltage scaling DAC, wherein said interposed impedance is any non-zero impedance not equal to $R_I$.

* * * * *